United States Patent
Liu et al.

(10) Patent No.: US 8,878,603 B2
(45) Date of Patent: Nov. 4, 2014

(54) METHOD AND DEVICE FOR DETECTING PWM WAVE

(75) Inventors: Yu Liu, Guangdong (CN); Xiaofeng Shen, Guangdong (CN); Jianhua Zhang, Guangdong (CN)

(73) Assignees: Shenzhen BYD Auto R&D Company Limited, Shenzhen, Guangdong (CN); BYD Company Limited, Shenzhen, Guangdong (CN)

( * ) Notice: Subject to any disclaimer, the term of this patent is extended or adjusted under 35 U.S.C. 154(b) by 66 days.

(21) Appl. No.: 13/530,818

(22) Filed: Jun. 22, 2012

(65) Prior Publication Data

US 2012/0319795 A1 Dec. 20, 2012

Related U.S. Application Data

(63) Continuation of application No. PCT/CN2010/080050, filed on Dec. 21, 2010.

(30) Foreign Application Priority Data

Dec. 22, 2009 (CN) .......................... 2009 1 0189235

(51) Int. Cl.
*H03D 3/00* (2006.01)
*H03K 9/08* (2006.01)
*G01R 29/027* (2006.01)

(52) U.S. Cl.
CPC .................................. *G01R 29/0273* (2013.01)
USPC .............................. 329/312; 332/109; 327/20

(58) Field of Classification Search
USPC .............................. 332/109; 327/20; 329/312
See application file for complete search history.

(56) References Cited

U.S. PATENT DOCUMENTS

| | | | |
|---|---|---|---|
| 5,625,269 A * | 4/1997 | Ikeda | 318/696 |
| 5,905,406 A * | 5/1999 | Sugden et al. | 329/312 |
| 7,795,826 B2 * | 9/2010 | Inoue | 318/400.03 |
| 2005/0225351 A1 | 10/2005 | Chen et al. | |
| 2009/0102514 A1 | 4/2009 | Hsu | |

FOREIGN PATENT DOCUMENTS

| | | |
|---|---|---|
| JP | S 57-208473 A | 12/1982 |
| JP | S 57-208474 A | 12/1982 |
| JP | H 10-38907 A | 2/1998 |
| WO | WO 2011/076103 A1 | 6/2011 |

OTHER PUBLICATIONS

PCT International Search Report and Written Opinion mailed Mar. 31, 2011, issued in International Application No. PCT/CN2010/080050 (10 pages).

* cited by examiner

*Primary Examiner* — Joseph Chang
(74) *Attorney, Agent, or Firm* — Finnegan, Henderson, Farabow, Garrett & Dunner LLP

(57) ABSTRACT

A device for detecting a PWM wave, comprising: a PWM wave generating module, configured to generate the PWM wave; a detecting module coupled to the PWM wave generating module, configured to receive the PWM wave and to determine an electric level of the PWM wave; a timer coupled to the detecting module, configured to start a counting when the detecting module receives the PWM wave, and to interrupt the counting when the counting reaches a predetermined value, the detecting module determining whether the electric level of the PWM wave is a high electric level or a low electric level when the counting is interrupted; and a calculating module coupled to the detecting module, configured to calculate a duty ratio of the PWM wave based on a number of high electric level and a number of low electric level of the PWM wave determined within one period of the PWM wave.

8 Claims, 3 Drawing Sheets

METHOD AND DEVICE FOR DETECTING PWM WAVE

CROSS-REFERENCE TO RELATED APPLICATIONS

The present application is a continuation of International Application No. PCT/CN2010/080050, filed Dec. 21, 2010, which claims the priority and benefits of Chinese Patent Application No. 200910189235.9, filed with China Patent Office on Dec. 22, 2009, the entirety of both of which are incorporated herein by reference.

TECHNICAL FIELD

The present disclosure relates to a method and a device for detecting a PWM wave in a battery pack of an electric vehicle.

BACKGROUND

Electric vehicles have gained traction in recent years as a new mode of transportation, and as an alternative to gasoline vehicles dependent on oil—a finite natural resource. It is well-known that a main source of power in the electric vehicle comes from the stored energy in a battery pack. The performance of the battery pack, however, is highly dependent on the external environment, in particular, the temperature of the surroundings. For example, when the surrounding temperature is sub-zero 20 degree centigrade, the discharge performance of a lithium battery deteriorates, and the battery may not function properly as a power source. As a result, the electric vehicle may not operate normally in cold climates and may even fail to start. In order to solve the above problems, a battery heating device is used to heat the battery pack so that the temperature of the battery can reach the minimum temperature for the electric vehicle to operate in cold climates.

Typically, the heating of the battery can be accomplished using a battery heating module driven by a Pulse-Width Modulation (PWM) wave. But first, the PWM wave has to be reliably detected during operation of the battery pack. The prior art generally discloses using a hardware circuit to detect the PWM wave. However, the hardware circuit disclosed in the prior art usually only detects the electric level of the PWM wave, for example, whether the PWM wave is at a high electric level or a low electric level, but may not be able to determine a duty ratio of the PWM wave.

SUMMARY

The present disclosure is directed to solve at least one of the problems in the prior art. Accordingly, the present disclosure provides a method and a device for detecting a PWM wave.

According to one embodiment, a method for detecting a PWM wave is provided, the method comprising: starting a first counting when the PWM wave is detected; interrupting the first counting when the first counting reaches a predetermined value; determining whether an electric level of the PWM wave is a high electric level or a low electric level when the first counting is interrupted; clearing the value of the first counting, starting a second counting, and interrupting the second counting when the second counting reaches the predetermined value, determining whether the electric level of the PWM wave is a high electric level or a low electric level when the second counting is interrupted; repeating, for a duration of one period of the PWM wave: clearing a value of a previous counting, starting a next counting, and interrupting the next counting when the next counting reaches the predetermined value; determining whether the electric level of the PWM wave is a high electric level or a low electric level when the next counting is interrupted; and calculating a duty ratio of the PWM wave based on the number of high electric level and the number of low electric level determined within one period of the PWM wave.

According to another embodiment of the present disclosure, a device for detecting a PWM wave is provided, the device comprising: a PWM wave generating module, configured to generate a PWM wave; a detecting module coupled to the PWM wave generating module and configured to receive the PWM wave and to determine an electric level of the PWM wave; a timer coupled to the detecting module and configured to start a counting when the detecting module receives the PWM wave, and to interrupt the counting when the count reaches a predetermined value, the detecting module determining whether the electric level of the PWM wave is a high electric level or a low electric level when the counting is interrupted; and a calculating module coupled to the detecting module and configured to calculate a duty ratio of the PWM wave based on a number of high electric level and a number of low electric level of the PWM wave determined within one period of the PWM wave.

The embodiments in the present disclosure can accurately calculate the duty ratio of the PWM wave according to the number of high electric level and the number of low electric level determined and recorded within one period of the PWM wave. If the duty ratio of the PWM wave does not satisfy a set of predetermined requirements, the PWM wave can then be adjusted to satisfy the set of predetermined requirements, so as to ensure the reliability of the PWM wave.

BRIEF DESCRIPTION OF THE DRAWINGS

These and other aspects and advantages of the invention will become apparent from the following descriptions in conjunction with the drawings.

DETAILED DESCRIPTION OF EMBODIMENTS

Figure 1:
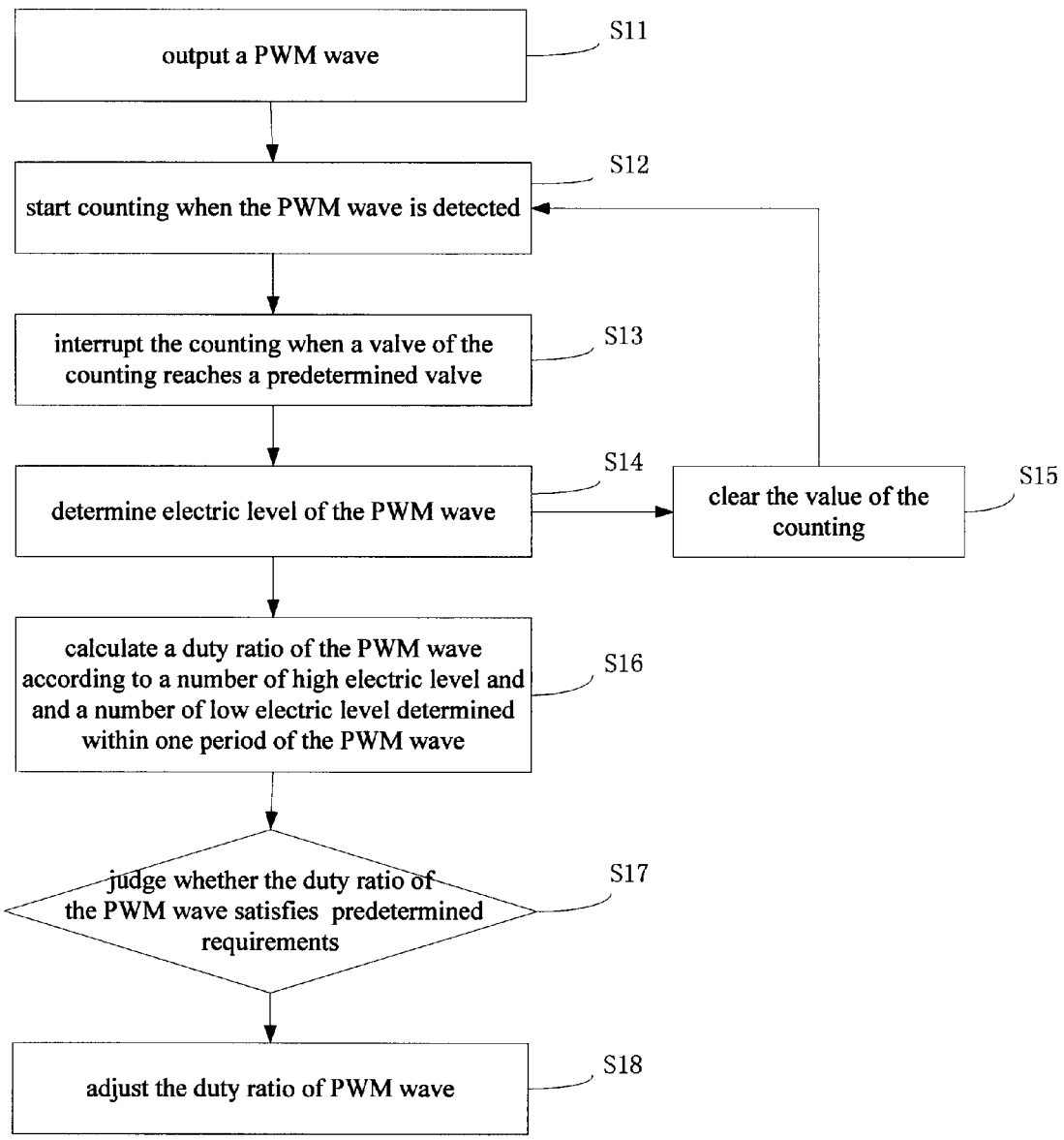
FIG. 1 shows a flow chart of a method for detecting a PWM wave according to one embodiment.

Reference will be made in detail to embodiments of the present invention. The embodiments described herein with reference to drawings are explanatory, illustrative, and are used to generally understand the present invention. The embodiments shall not be construed to limit the present invention. Same or similar elements and elements having the same or similar functions are denoted by common reference numerals throughout the descriptions.

A method for detecting a PWM wave according to an embodiment comprises: starting a first counting when the PWM wave is detected; interrupting the first counting when the first counting reaches a predetermined value; determining whether an electric level of the PWM wave is a high electric level or a low electric level when the first counting is interrupted; clearing the value of the first counting, starting a second counting, and interrupting the second counting when the second counting reaches the predetermined value; determining whether the electric level of the PWM wave is a high electric level or a low electric level when the second counting is interrupted; repeating, for a duration of one period of the PWM wave: clearing a value of a previous counting, starting a next counting, and interrupting the next counting when the next counting reaches the predetermined value; determining whether the electric level of the PWM wave is a high electric level or a low electric level when the next counting is interrupted; and calculating a duty ratio of the PWM wave based on the number of high electric level and the number of low electric level determined within one period of the PWM wave.

Figure 4:
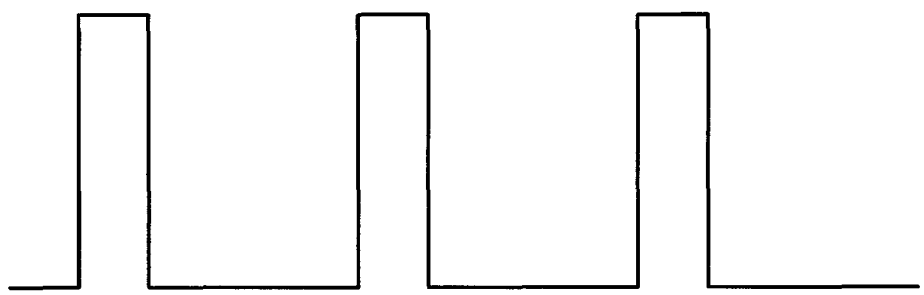
FIG. 4 shows a schematic diagram of the PWM wave output by the MCU of FIG. 3.

An exemplary method for detecting a PWM wave is next described with reference to FIG. 1 and FIGS. 4-6, the method comprising the following steps:

As shown in FIG. 4, a PWM wave is output (step S11), and a counting is started when the PWM wave is detected (step S12). When the counting reaches a predetermined value, the counting is interrupted (step S13). Next, an electric level of the PWM wave is determined and recorded as a high electric level or a low electric level when the counting is interrupted (step S14). For example, a low electric level may be denoted by a "0" and a high electric level may be denoted by a "1". After the electric level of the PWM wave has been recorded, the value of the counting is cleared (step S15), and steps S12 to S15 are repeated for a duration of one period of the PWM wave, as further illustrated in FIGS. 4-6.

At step S16, the duty ratio of the PWM wave is calculated based on the number of high electric level and the number of low electric level determined and recorded within one period of the PWM wave.

In some embodiments, the duty ratio M of the PWM wave is calculated using the following equation $M=P_h/(P_h+P_l)$, where $P_h$ is the number of high electric level determined within one period of the PWM wave, and $P_l$ is the number of low electric level determined within one period of the PWM wave.

One of ordinary skill in the art will appreciate that the number of high electric level and the number of low electric level may increase correspondingly with an increase in the interruption times. Thus, the shorter the interval time between consecutive interruptions, the greater the number of high electric level and the number of low electric level determined within one period of the PWM wave, which can then allow a more accurate duty ratio to be calculated.

In another embodiment, the method for detecting the PWM wave may further include determining whether the duty ratio of the PWM wave satisfies a set of predetermined requirements (step S17). If the duty ratio of the PWM wave does not satisfy the set of predetermined requirements, the duty ratio of the PWM wave can be adjusted (step S18) to ensure reliability of the PWM wave.

A device for detecting a PWM wave according to one embodiment is next described as follows.

Figure 2:
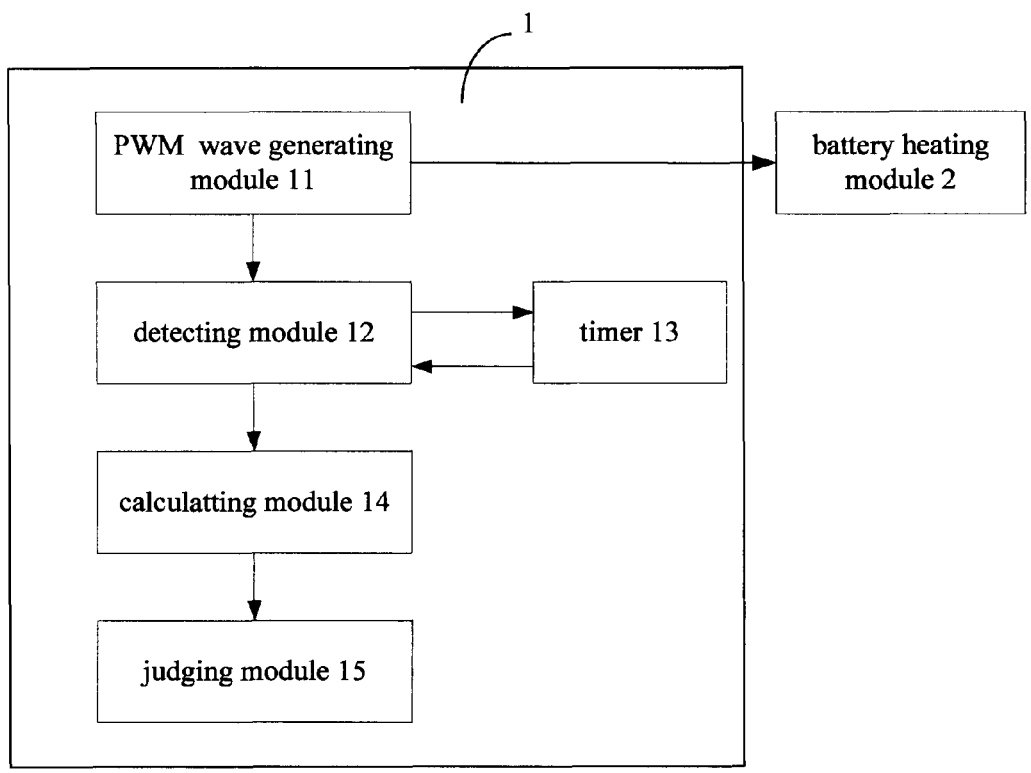
FIG. 2 shows a schematic diagram of a device for detecting a PWM wave according to the embodiment of FIG. 1.
Figure 3:
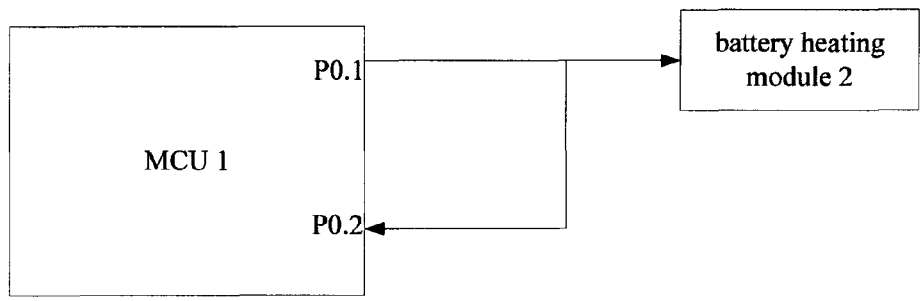
FIG. 3 shows a schematic diagram of a Micro-Controller Unit (MCU) according to one embodiment.

With reference to FIGS. 2 and 3, a device 1 may comprise: a PWM wave generating module 11, a detecting module 12, a timer 13, and a calculating module 14.

The PWM wave generating module 11 is configured to generate a PWM wave. The detecting module 12 is coupled to the PWM wave generating module 11, and configured to receive the PWM wave generated by the PWM wave generating module 11 and determine an electric level of the PWM wave.

The timer 13 is coupled to the detecting module 12, and configured to start a counting when the detecting module 12 receives the PWM wave, and to interrupt the counting when the counting reaches a predetermined value.

When the counting is interrupted, the detecting module 12 determines whether the electric level of the PWM wave is a high electric level or a low electric level, and records the corresponding electric level.

The calculating module 14 is coupled to the detecting module 12, and configured to calculate a duty ratio of the PWM wave based on the number of high electric level and the number of low electric level of the PWM wave that are determined and recorded within one period of the PWM wave.

In some embodiments, the duty ratio M of the PWM wave is calculated using the following equation $M=P_h/(P_h+P_l)$, where $P_h$ is the number of high electric level determined within one period of the PWM wave, and $P_l$ is the number of low electric level determined within one period of the PWM wave.

In another embodiment of the present disclosure, the device may further comprise a judging module 15. The judging module 15 is coupled to the calculating module 14, and configured to determine whether the duty ratio of the PWM wave satisfies a set of predetermined requirements, and to adjust the PWM wave if the duty ratio of the PWM wave does not satisfy the set of predetermined requirements. The device 1 may be connected to a battery heating module 2, as shown in FIGS. 2 and 3, and the PWM wave may be sent to the battery heating module 2 if the duty ratio of the PWM wave satisfies the set of predetermined requirements.

In the exemplary device shown in FIG. 3, the PWM wave generating module 11, the detecting module 12, the timer 13, and the calculating module 14 are incorporated into a MCU (Micro-Controller Unit) 1. The MCU 1 may have one fixed end to output the generated PWM wave, with the other ends serving as feedback input ends to receive the PWM wave and to determine the electric level of the PWM wave. As shown in FIG. 3, port P0.1 of the MCU 1 may be used as an output port to output the PWM wave, and port P0.2 of the MCU 1 may be used as an input port. The port P0.1 that is used to output the PWM wave may be further coupled to the input port P0.2 of the MCU 1 by a transmission line.

When the MCU 1 starts to operate, the port P0.1 starts to output the high electric level or low electric level with a fixed period and duty ratio. As shown in FIG. 4, the electric level of the port P0.2 may be a high electric level or a low electric level. Furthermore, when the MCU 1 starts to operate, a counter in the timer 13 also begins a counting, and when the counting reaches a predetermined value, the timer 13 interrupts the counting. The electric level of the port P0.2 is determined and recorded when the counting is interrupted. After the electric level is recorded, the counter is reset for a next count.

In some embodiments, the predetermined value may be determined based on a bus time of the MCU 1 and a frequency division value of the timer. For example, if the bus clock rate of the MCU 1 is 48M (that is, 1/48000000 S), the frequency division value of the timer is zero (i.e., there is no frequency division), and the predetermined value may be 4800, whereby the interval time between consecutive interruptions is 0.1 ms. It should be appreciated that the present disclosure is not limited to the above example, and one of ordinary skill in the art will appreciate that the predetermined value can be changed to any value that is an integer times of the bus clock rate of the MCU1 (such as 9600 or 2400). It should also be understood that the smaller the predetermined value, the greater the number of electric level that can be determined, which subsequently allows a more accurate duty ratio to be calculated.

Figure 5:
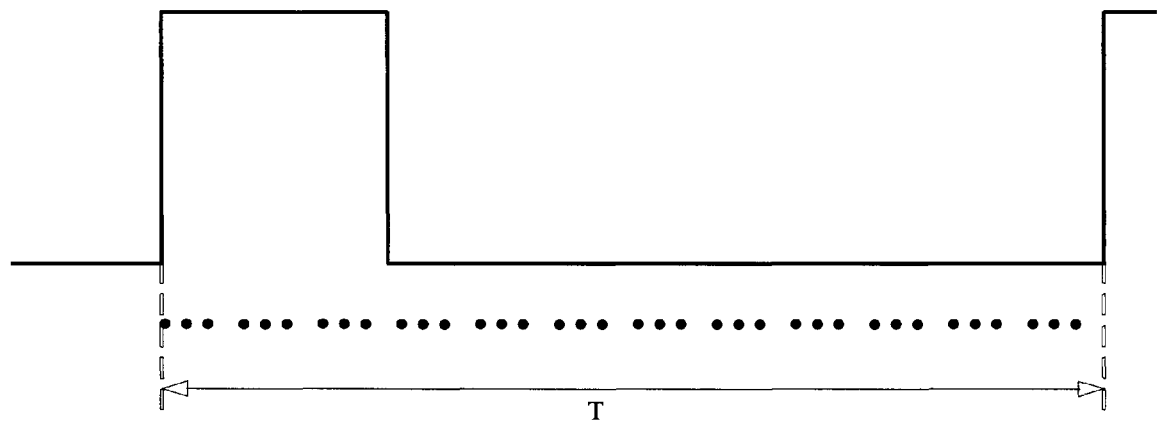
FIG. 5 shows a schematic diagram of a electric level determined within one period of the PWM wave according to one embodiment.
Figure 6:
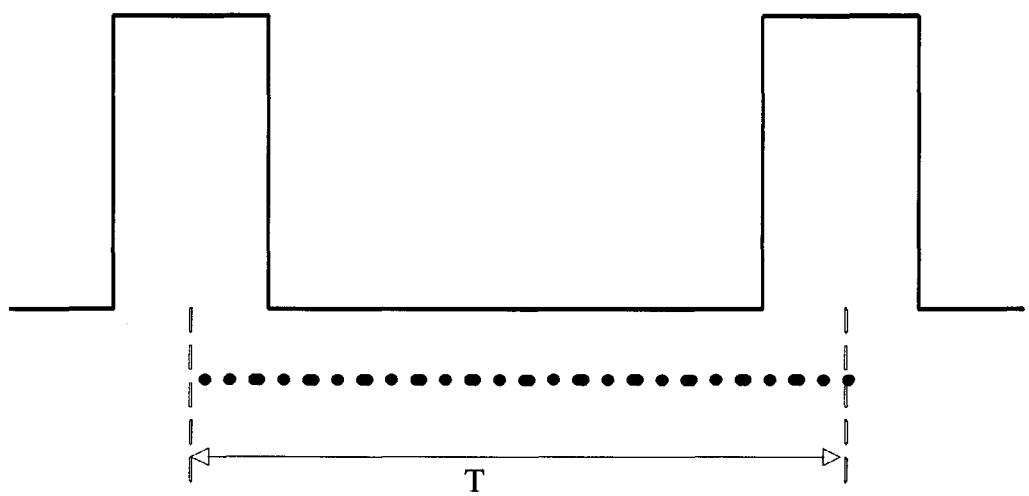
FIG. 6 shows a schematic diagram of the electric level determined within one period of the PWM wave according to another embodiment.

For example, assuming the period of the PWM wave is 20 ms and the predetermined value is 4800, with the timer interrupting the counting at every 0.1 ms interval, the electric level at the port P0.2 is then recorded 200 times within one period T. As shown in FIGS. 5 and 6, the black dots represent the state of the electric level state, in which the high electric level is recorded 50 times, and the low electric level is recorded 150 times. In other words, within one period, the high electric level at the port P0.2 is 5 ms and the low electric level at the port P0.2 is 15 ms. The duty ratio of the PWM wave is then calculated by dividing 200 by 50, using the equation $M=P_h/(P_h+P_l)$, where $P_h$ is the number of high electric level determined within one period of the PWM wave, and $P_l$ is the number of low electric level determined within one period of the PWM wave.

Thus, the embodiments described in the present disclosure can accurately calculate the duty ratio of the PWM wave based on the number of high electric level and the number of low electric level determined and recorded within one period of the PWM wave. If the duty ratio of the PWM wave does not satisfy a set of predetermined requirements, the PWM wave can be adjusted to satisfy the set of predetermined requirements, so as to ensure the reliability of the PWM wave.

Although explanatory embodiments have been shown and described, it would be appreciated by those skilled in the art that changes, alternatives, and modifications can be made in the embodiments without departing from spirit and principles of the disclosure. Such changes, alternatives, and modifications all fall into the scope of the claims and their equivalents.

What is claimed is:

1. A method for detecting a Pulse-Width Modulation (PWM) wave, comprising:
    starting a first counting when the PWM wave is detected;
    interrupting the first counting when the first counting reaches a predetermined value;
    determining whether an electric level of the PWM wave is a high electric level or a low electric level when the first counting is interrupted;
    clearing a value of the first counting, starting a second counting, and interrupting the second counting when the second counting reaches the predetermined value;
    determining whether the electric level of the PWM wave is a high electric level or a low electric level when the second counting is interrupted;
    repeating, for a period of the PWM wave:
        clearing a value of a previous counting, starting a next counting, and interrupting the next counting when the next counting reaches the predetermined value;
        determining whether the electric level of the PWM wave is a high electric level or a low electric level when the next counting is interrupted; and
    calculating a duty ratio of the PWM wave based on the number of high electric level and the number of low electric level determined within one period of the PWM wave.

2. The method of claim 1, further comprising:
    determining whether the duty ratio of the PWM wave satisfies a set of predetermined requirements; and
    adjusting the PWM wave if the duty ratio of the PWM wave does not satisfy the set of predetermined requirements.

3. The method of claim 1, wherein the duty ratio M of the PWM wave is calculated using a formula $M=P_h/(P_h+P_l)$, where $P_h$ is the number of high electric level determined within one period of the PWM wave, and $P_l$ is the number of low electric level determined within one period of the PWM wave.

4. A device for detecting a PWM wave, comprising:
    a PWM wave generating module, configured to generate the PWM wave;
    a detecting module coupled to the PWM wave generating module, configured to receive the PWM wave and determine an electric level of the PWM wave;
    a timer coupled to the detecting module, configured to start a counting when the detecting module receives the PWM wave, and to interrupt the counting when the counting reaches a predetermined value, the detecting module determining whether the electric level of the PWM wave is a high electric level or a low electric level when the counting is interrupted; and
    a calculating module coupled to the detecting module, configured to calculate a duty ratio of the PWM wave based on a number of high electric level and a number of low electric level of the PWM wave determined within one period of the PWM wave.

5. The device of claim 4, further comprising: a determining module coupled to the calculating module and configured to determine whether the duty ratio of the PWM wave satisfies a set of predetermined requirements, and to adjust the PWM wave if the duty ratio of the PWM wave does not satisfy the set of predetermined requirements.

6. The device of claim 4, wherein the calculating module is configured to calculate the duty ratio of the PWM wave using a formula $M=P_h/(P_h+P_l)$, where $P_h$ is a number of high electric level determined within one period of the PWM wave, and $P_l$ is a number of low electric level determined within one period of the PWM wave.

7. The device of claim 4, wherein the PWM wave generating module, the detecting module, the timer, and the calculating module are integrated into a Micro-Controller Unit (MCU).

8. The device of claim 7, wherein an interval time between consecutive interruptions of the timer is determined based on a bus time of the MCU and a frequency division value of the timer.

* * * * *